(12) United States Patent
Chan (10) Patent No.: US 12,396,137 B2
(45) Date of Patent: Aug. 19, 2025

(54) ELECTRONIC MODULE WITH LEAK-PROOF STRUCTURE

(71) Applicant: Delta Electronics, Inc., Taoyuan (TW)

(72) Inventor: I-Wen Chan, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 210 days.

(21) Appl. No.: 18/465,591

(22) Filed: Sep. 12, 2023

(65) Prior Publication Data
US 2025/0016961 A1    Jan. 9, 2025

(30) Foreign Application Priority Data
Jul. 4, 2023 (CN) .......................... 202310810036.5

(51) Int. Cl.
*H05K 7/20*     (2006.01)
(52) U.S. Cl.
CPC ....... *H05K 7/20463* (2013.01); *H05K 7/2029* (2013.01); *H05K 7/20481* (2013.01)
(58) Field of Classification Search
CPC ............. H05K 7/20463; H05K 7/2029; H05K 7/20481
USPC ........................................................ 361/704
See application file for complete search history.

(56) References Cited

U.S. PATENT DOCUMENTS

| | | | | |
|---|---|---|---|---|
| 9,093,563 B2 * | 7/2015 | Blackshear | ............. | H01L 23/10 |
| 11,482,470 B2 * | 10/2022 | Huang | ................... | H01L 23/42 |
| 2001/0005312 A1 * | 6/2001 | Johnson | ............... | H01L 23/4093 |
| | | | | 257/E23.086 |
| 2004/0036162 A1 * | 2/2004 | Chuang | ............... | H01L 23/4006 |
| | | | | 257/E23.102 |
| 2007/0069345 A1 * | 3/2007 | Liu | ..................... | H01L 23/4334 |
| | | | | 257/667 |
| 2007/0070603 A1 * | 3/2007 | Park | ...................... | H01L 23/473 |
| | | | | 257/E23.098 |
| 2009/0040726 A1 * | 2/2009 | Hoffman | ............. | F28D 15/0233 |
| | | | | 29/890.032 |
| 2018/0184538 A1 * | 6/2018 | Bayerer | ............... | H05K 7/2039 |

(Continued)

FOREIGN PATENT DOCUMENTS

| CN | 110099541 A | * | 8/2019 |
|---|---|---|---|
| TW | I723802 B | | 4/2021 |

(Continued)

*Primary Examiner* — Anatoly Vortman
(74) *Attorney, Agent, or Firm* — Muncy, Geissler, Olds & Lowe, P.C.

(57) ABSTRACT

An electronic module with a leak-proof structure is provided. The electronic module with a leak-proof structure includes a carrier, a heat source, a metal frame, an elastic isolating member, a liquid-metal material and a heatsink. The heat source is disposed on the carrier. The metal frame is disposed on the carrier. The metal frame surrounds the heat source. The elastic isolating member is disposed between the metal frame and the heat source. The elastic isolating member includes a continuous wall and the base plate, the base plate is connected to the bottom of the continuous wall, a central opening is formed on the base plate, the heat source corresponds to the central opening, and the continuous wall defines a receiving space. The liquid-metal material is disposed on the heat source. The heatsink includes a heatsink bottom and a protrusion, wherein the protrusion is inserted into the receiving space.

10 Claims, 6 Drawing Sheets

(56) References Cited

U.S. PATENT DOCUMENTS

| | | |
|---|---|---|
| 2020/0168523 A1 | 5/2020 | Huang et al. |
| 2021/0287962 A1* | 9/2021 | Huang .................... H01L 24/83 |
| 2024/0213115 A1* | 6/2024 | Kazem .................... H01L 23/42 |

FOREIGN PATENT DOCUMENTS

| | | |
|---|---|---|
| TW | M619587 U | 11/2021 |
| TW | M625923 U | 4/2022 |
| TW | M629463 U | 7/2022 |
| TW | 202248396 A | 12/2022 |

* cited by examiner

ELECTRONIC MODULE WITH LEAK-PROOF STRUCTURE

CROSS REFERENCE TO RELATED APPLICATIONS

This application claims priority of China Patent Application No. 202310810036.5, filed on Jul. 4, 2023, the entirety of which is incorporated by reference herein.

BACKGROUND OF THE INVENTION

Field of the Invention

The present invention relates to an electronic module, and, in particular, to an electronic module with a leak-proof structure.

Description of the Related Art

Liquid-metal material is commonly utilized in electronic modules to conduct heat and electricity. A conventional electronic module includes a carrier, a chip (heat source) and a metal frame. The chip is disposed on the carrier. The metal frame surrounds the chip. The liquid-metal material contacts the upper surface of the chip. To prevent the liquid-metal material from leaking, a sealant is applied to the metal frame. However, the sealant may stick to the heatsink, making the heatsink difficult to disassemble. Moreover, the gluing and drying processes of the sealant are not only labor-intensive but also time-consuming, thus the production cost is increased. Additionally, the liquid-metal material leaks easily, which can cause short-circuiting of electronic components.

BRIEF SUMMARY OF THE INVENTION

An embodiment of the present invention provides an electronic module with a leak-proof structure. The electronic module with a leak-proof structure includes a carrier, a heat source, a metal frame, an elastic isolating member, a liquid-metal material and a heatsink. The heat source is disposed on the carrier. The metal frame is disposed on the carrier. The metal frame surrounds the heat source. The elastic isolating member is disposed between the metal frame and the heat source. The elastic isolating member comprises a continuous wall and the base plate, the base plate is connected to the bottom of the continuous wall, a central opening is formed on the base plate, the heat source corresponds to the central opening, and the continuous wall defines a receiving space. The liquid-metal material is disposed on the heat source, wherein the elastic isolating member is adapted to restrict the liquid-metal material. The heatsink includes a heatsink bottom and a protrusion, wherein the protrusion is formed on the heatsink bottom, and the protrusion is inserted into the receiving space and contacts the liquid-metal material.

In one embodiment, the elastic isolating member comprises an isolating material.

In one embodiment, the electronic module further comprises plurality of electronic components and a waterproof material, wherein the electronic components are disposed on the carrier, the electronic components are located between the metal frame and the heat source, and the waterproof material covers the electronic components.

In one embodiment, the base plate of the elastic isolating member corresponds to the waterproof material.

In one embodiment, the electronic module further comprises an elastic conductive member, wherein the elastic conductive member surrounds the elastic isolating member, and the elastic conductive member is sandwiched between the heatsink bottom and the metal frame.

In one embodiment, the liquid-metal material comprises indium.

In one embodiment, the elastic isolating member comprises an elastic isolating foam.

In one embodiment, the elastic isolating member further comprises a plastic material, and the plastic material is disposed on the upper surface of the elastic isolating member.

In one embodiment, the continuous wall is made of elastic isolating foam, the base plate is made of elastic isolating foam, the elastic isolating member further comprises a first plastic material and a second plastic material, the first plastic material is disposed on the upper surface of the continuous wall, and the second plastic material is disposed on the upper surface of the base plate.

In one embodiment, the elastic isolating member comprises thermal silicone.

In the electronic module of the embodiment of the invention, the elastic isolating member is utilized to replace the conventional sealant. The elastic isolating member can be assembled and disassembled easily, and reduces manufacturing cost, which overcomes various shortcomings of the conventional sealants. Additionally, the elastic isolating member covers the electronic components between the metal frame and the heat source, the electronic components are protected, and short-circuits are prevented. Additionally, the shape of the protrusion matches the shape of the elastic isolating member, and the liquid-metal material is prevented from overflowing.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
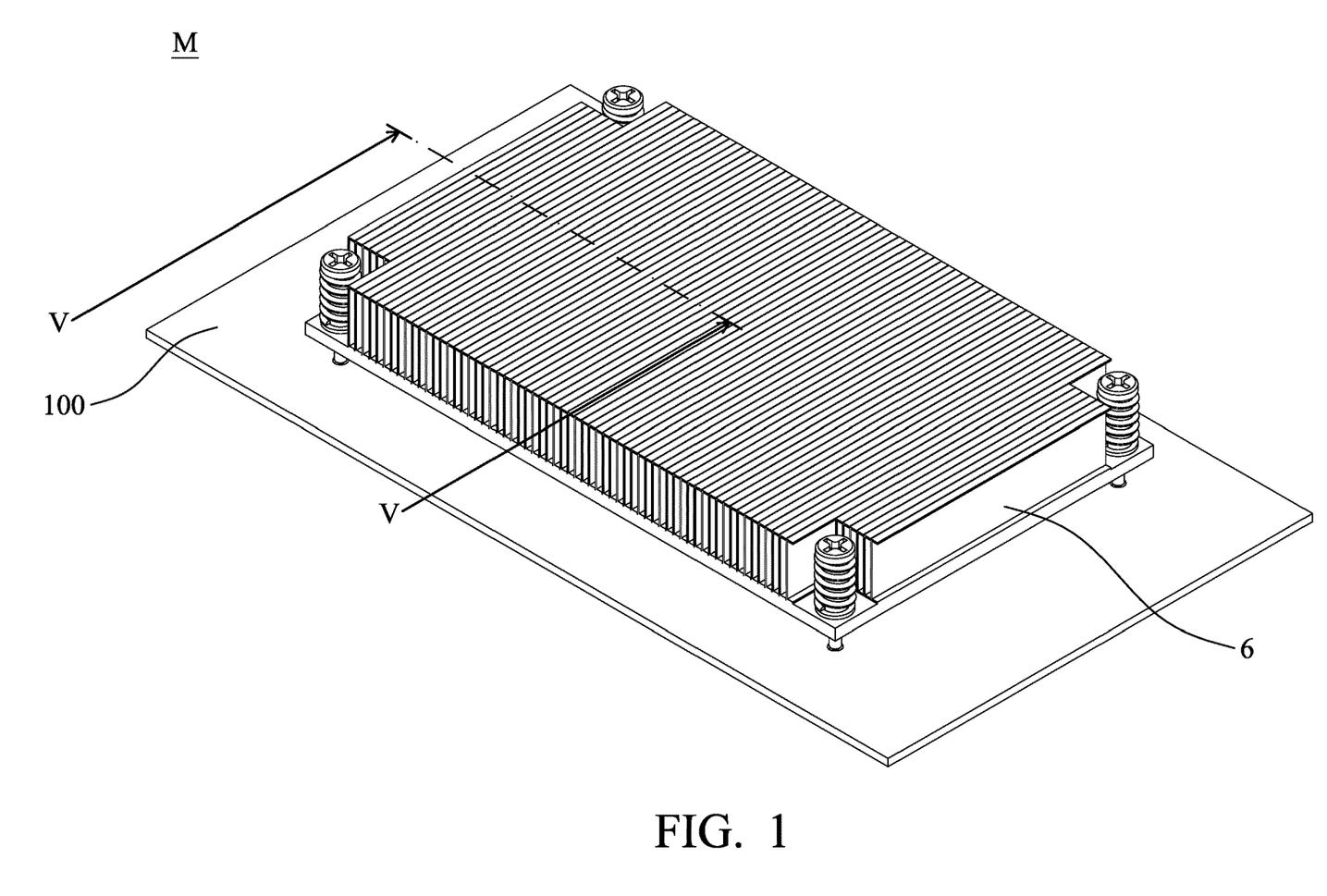
FIG. 1 is an assembled view of the electronic module of the embodiment of the invention.
Figure 2:
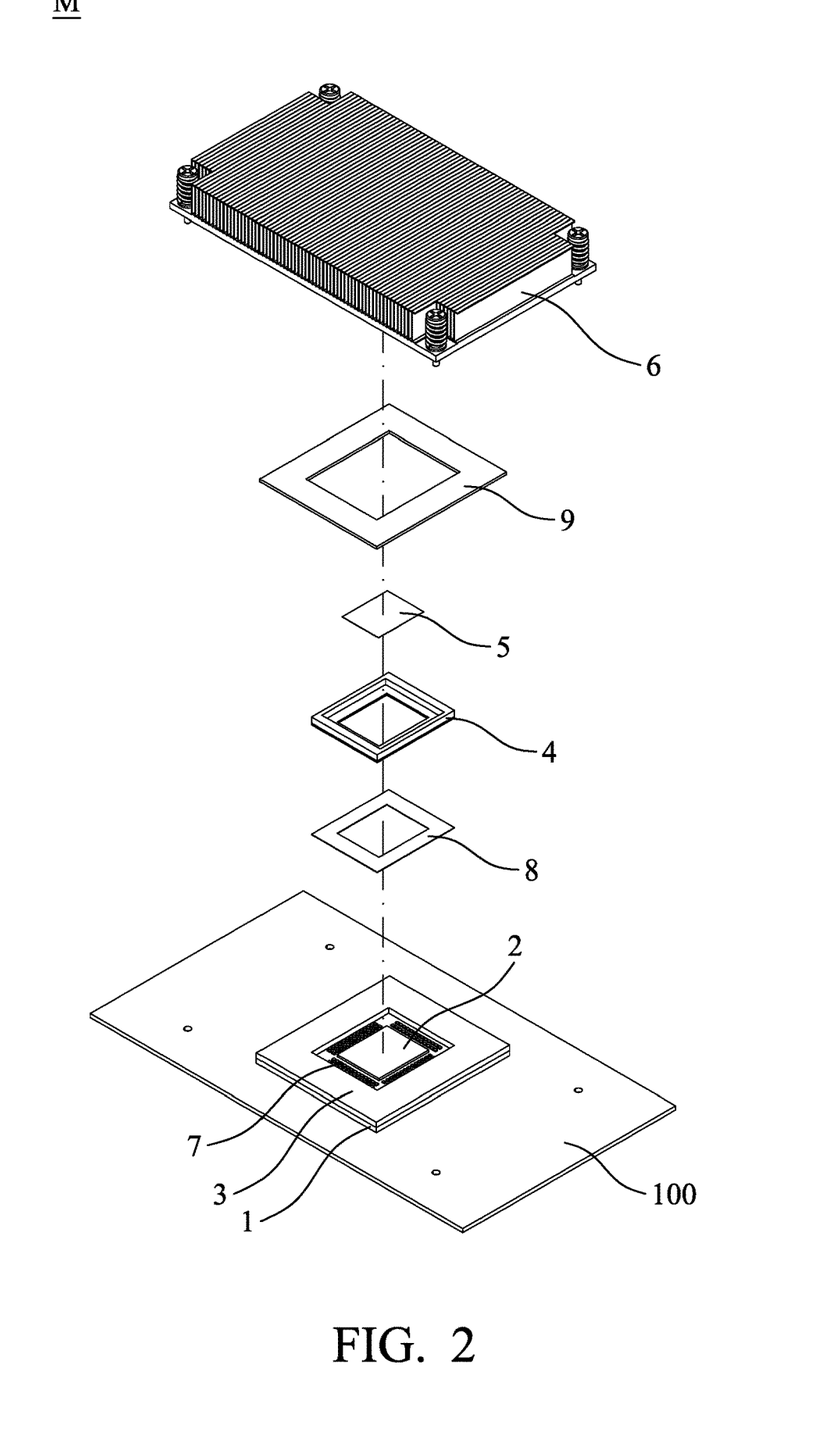
FIG. 2 is an exploded view of the electronic module of the embodiment of the invention.

FIG. 1 is an assembled view of the electronic module of the embodiment of the invention. FIG. 2 is an exploded view of the electronic module of the embodiment of the invention. With reference to FIGS. 1 and 2, the electronic module M of the embodiment of the invention includes a carrier 1, a heat source 2, a metal frame 3, an elastic isolating member 4, a liquid-metal material 5 and a heatsink 6. The heat source 2 is disposed on the carrier 1. The metal frame 3 is disposed on the carrier 1. The metal frame 3 surrounds the heat source 2. The elastic isolating member 4 is disposed between the metal frame 3 and the heat source 2. The carrier 1 is disposed on a circuit board 100.

In one embodiment, the heat source 2 can be a central processing unit (CPU), a graphics processing unit (GPU), a network processing unit (NPU) or other electronic components. The disclosure is not meant to restrict the invention.

Figure 3A:
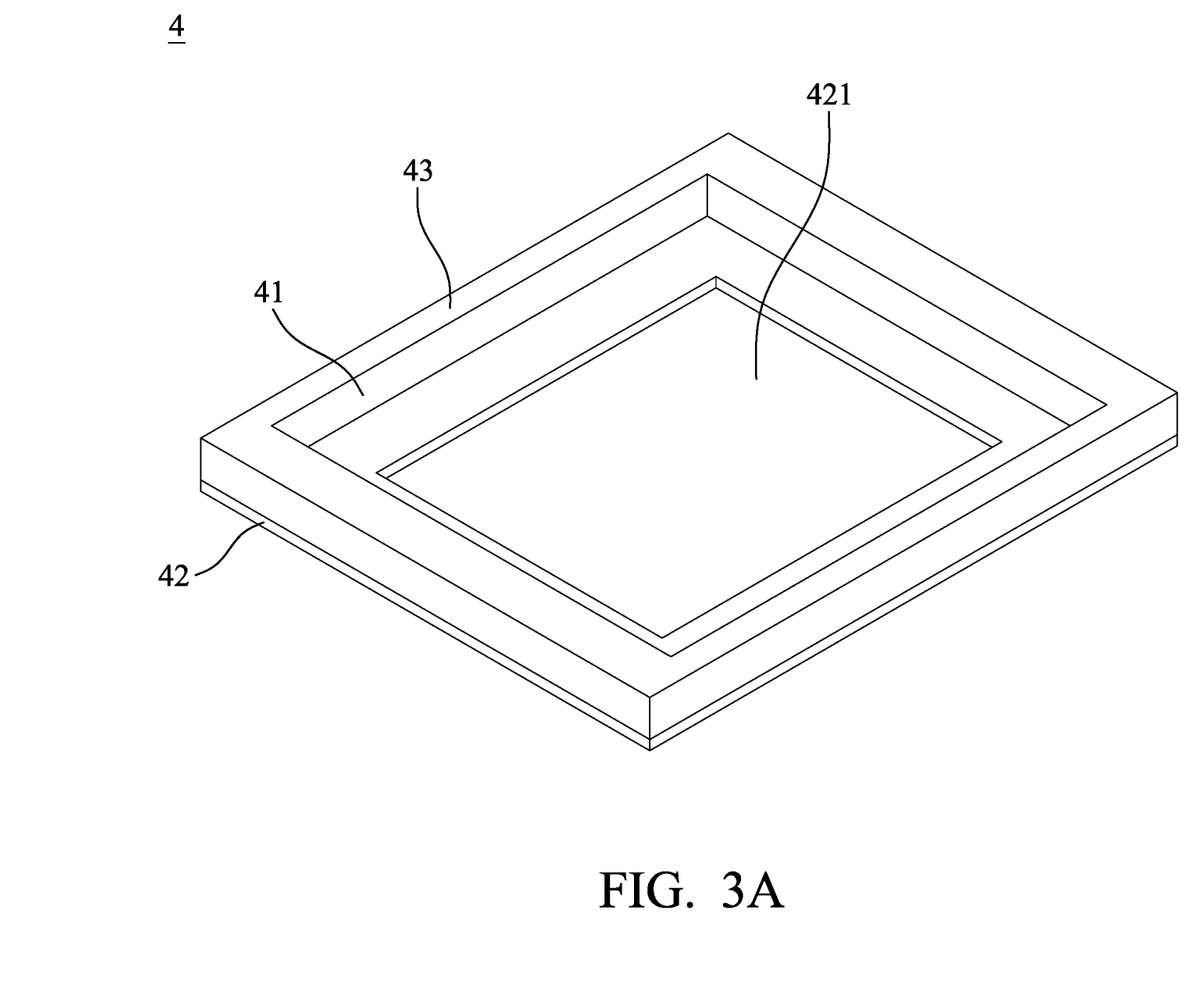
FIG. 3A shows the details of the elastic isolating member of the embodiment of the invention.

FIG. 3A shows the details of the elastic isolating member of the embodiment of the invention. With reference to FIGS. 2 and 3A, the elastic isolating member 4 includes a continuous wall 41 and a base plate 42. The base plate 42 is connected to the bottom of the continuous wall 41. A central opening 421 is formed on the base plate 42. The heat source 2 corresponds to the central opening 421. The continuous wall 41 defines a receiving space. The liquid-metal material 5 is disposed on the heat source 2. The elastic isolating member 4 is adapted to restrict the liquid-metal material 5.

In one embodiment, the heat source 2 contacts the liquid-metal material 5 via the central opening 421. The size of the central opening 421 matches the size of the heat source 2, and the liquid-metal material 5 is thus prevented from being leaked.

The liquid-metal material 5 includes the metal material which can be liquefied. The liquid-metal material 5 can also be thermal paste including metal composition. In one embodiment, the liquid-metal material 5 includes indium to provide improved thermal conduction. The disclosure is not meant to restrict the invention.

Figure 4:
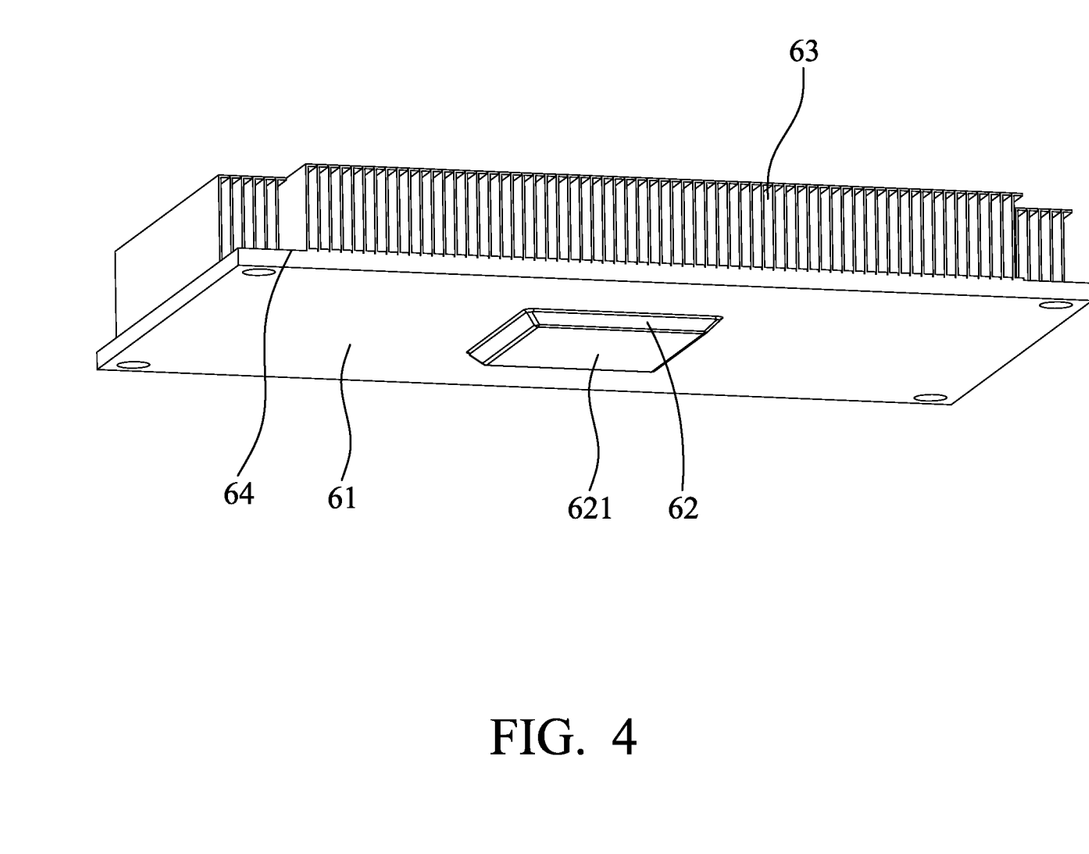
FIG. 4 shows the details of the heatsink of the embodiment of the invention.
Figure 5:
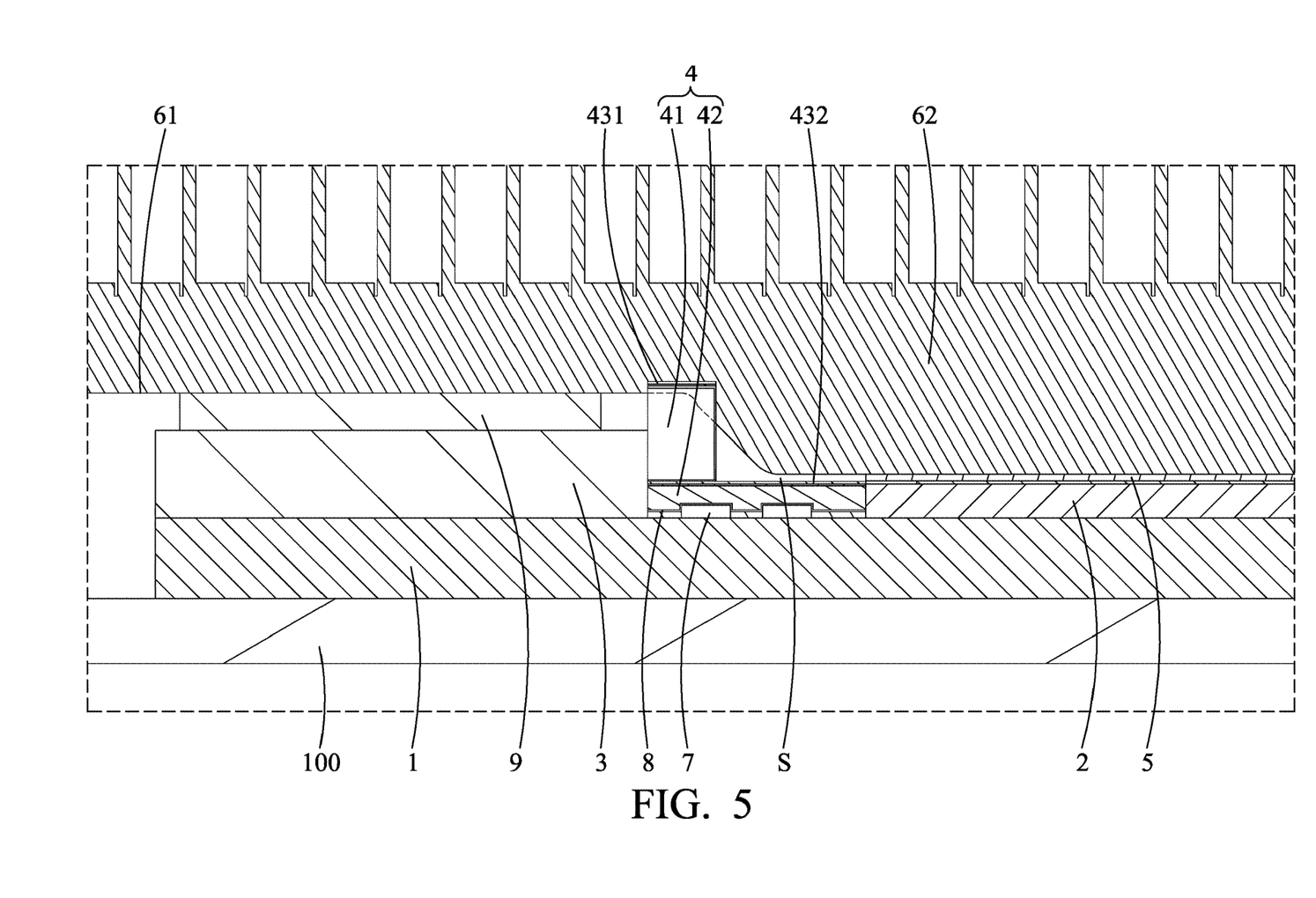
FIG. 5 is a cross sectional view of the electronic module of the embodiment of the invention along V-V direction of FIG. 1.

FIG. 4 shows the details of the heatsink of the embodiment of the invention. FIG. 5 is a cross sectional view of the electronic module of the embodiment of the invention along V-V direction of FIG. 1. With reference to FIGS. 4 and 5, in one embodiment, the heatsink 6 includes a heatsink bottom 61 and a protrusion 62. The protrusion 62 is formed on the heatsink bottom 61. The protrusion 62 is inserted into the receiving space S and contacts the liquid-metal material 5. In one embodiment, the heatsink 6 further comprises fins 63, and the fins 63 are disposed on a top surface 64 of a heatsink base of the heatsink 6.

With reference to FIGS. 2 and 5, in one embodiment, the continuous wall 41 can being interfered with the protrusion 62 to provide improved leaking proof effect.

With reference to FIGS. 2, 3A, 4 and 5, in one embodiment, the area of a protrusion bottom 621 of the protrusion 62 is greater than the area of the central opening 421. The protrusion bottom 621 thus can sufficiently cover the central opening 421 to provide improved leaking proof effect.

With reference to FIGS. 2 and 5, in one embodiment, the elastic isolating member 4 comprises an isolating material.

With reference to FIGS. 2 and 5, in one embodiment, the electronic module further comprises plurality of electronic components 7 and a waterproof material 8. The electronic components 7 are disposed on the carrier 1. The electronic components 7 are located between the metal frame 3 and the heat source 2. The waterproof material 8 covers the electronic components 7.

In one embodiment, the waterproof material 8 may be a waterproof coating. The disclosure is not meant to restrict the invention. In another embodiment, the waterproof material 8 may also be an adhesive film or other waterproof materials.

The electronic components 7 may be capacitors, inductors or other electrical components. The disclosure is not meant to restrict the invention.

With reference to FIGS. 3A and 5, in one embodiment, the base plate 42 of the elastic isolating member 4 corresponds to the waterproof material 8. Particularly, the base plate 42 covers and abuts the waterproof material 8 to prevent the liquid-metal material 5 from overflowing to the electronic components 7, and short-circuits are prevented.

With reference to FIGS. 2 and 5, in one embodiment, the electronic module further comprises an elastic conductive member 9. The elastic conductive member 9 surrounds the elastic isolating member 4. The elastic conductive member 9 is sandwiched between the heatsink bottom 61 and the metal frame 3. The elastic conductive member 9 and the metal frame 3 prevent electromagnetic interference leakage.

Figure 3B:
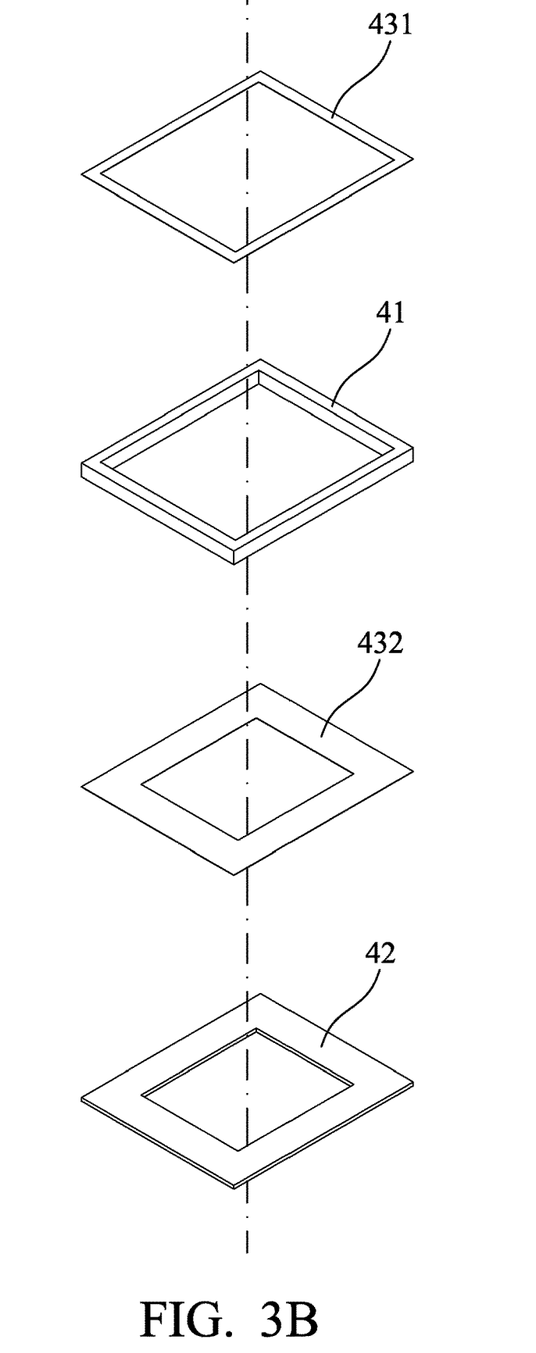
FIG. 3B is an exploded view of the elastic isolating member of another embodiment of the invention.

FIG. 3B is an exploded view of the elastic isolating member of another of the invention. With reference to FIG. 3B, in this embodiment, the elastic isolating member 4 is majorly made of elastic isolating foam. For example, the continuous wall 41 and the base plate 42 are made of elastic isolating foam. Additionally, the elastic isolating member 4 further comprises a first plastic material 431 and a second plastic material 432. The first plastic material 431 is disposed on the upper surface of the continuous wall 41. The second plastic material 432 is disposed on the upper surface of the base plate 42. The first plastic material 431 can be attached to the upper surface of the continuous wall 41 with glue. The second plastic material 432 can be attached to the upper surface of the base plate 42 with glue.

In one embodiment, since the plastic material has an anti-adhesion function, it can prevent the liquid-metal material 5 from adhering to the elastic isolating member 4.

In another embodiment, the elastic isolating member 4 can be made of thermal silicone. The elastic isolating member 4 can be integrally formed, or formed by a continuous wall attached to the base plate. In this embodiment, since the thermal silicone itself has an anti-adhesion function, no plastic material is required on the surface of the heat-conducting silicon rubber.

In the electronic module of the embodiment of the invention, the elastic isolating member is utilized to replace the conventional sealant. The elastic isolating member can be assembled and disassembled easily, and reduces manufacturing cost, which overcomes various shortcomings of the conventional sealants. Additionally, the elastic isolating member covers the electronic components between the metal frame and the heat source, the electronic components are protected, and short-circuits are prevented. Additionally, the shape of the protrusion matches the shape of the elastic isolating member, and the liquid-metal material is prevented from overflowing.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. An electronic module with a leak-proof structure, comprising:
a carrier;
a heat source, disposed on the carrier;

a metal frame, disposed on the carrier, wherein the metal frame surrounds the heat source;

an elastic isolating member, disposed between the metal frame and the heat source, wherein the elastic isolating member comprises a continuous wall and a base plate, the base plate is connected to a bottom of the continuous wall, a central opening is formed on the base plate, the heat source corresponds to the central opening, and the continuous wall defines a receiving space;

a liquid-metal material, disposed on the heat source, wherein the elastic isolating member restricts the liquid-metal material; and a heatsink, comprising a heatsink bottom and a protrusion, wherein the protrusion is formed on the heatsink bottom, the protrusion is inserted into the receiving space and contacts the liquid-metal material.

2. The electronic module with a leak proof structure as claimed in claim 1, wherein the elastic isolating member comprises an isolating material.

3. The electronic module with a leak-proof structure as claimed in claim 2, further comprising a plurality of electronic components and a waterproof material, wherein the electronic components are disposed on the carrier, the electronic components are located between the metal frame and the heat source, and the waterproof material covers the electronic components.

4. The electronic module with a leak-proof structure as claimed in claim 3, wherein the base plate of the elastic isolating member corresponds to the waterproof material.

5. The electronic module with a leak-proof structure as claimed in claim 2, further comprising an elastic conductive member, wherein the elastic conductive member surrounds the elastic isolating member, and the elastic conductive member is sandwiched between the heatsink bottom and the metal frame.

6. The electronic module with a leak-proof structure as claimed in claim 2, wherein the liquid-metal material comprises indium.

7. The electronic module with a leak-proof structure as claimed in claim 2, wherein the elastic isolating member comprises an elastic isolating foam.

8. The electronic module with a leak-proof structure as claimed in claim 7, wherein the elastic isolating member further comprises a plastic material, and the plastic material is disposed on an upper surface of the elastic isolating member.

9. The electronic module with a leak-proof structure as claimed in claim 2, wherein the continuous wall is made of an elastic isolating foam, the base plate is made of the elastic isolating foam, the elastic isolating member further comprises a first plastic material and a second plastic material, the first plastic material is disposed on an upper surface of the continuous wall, and the second plastic material is disposed on an upper surface of the base plate.

10. The electronic module with a leak-proof structure as claimed in claim 2, wherein the elastic isolating member comprises thermal silicone.

* * * * *